(12) United States Patent
Akerib et al.

(10) Patent No.: US 10,832,746 B2
(45) Date of Patent: Nov. 10, 2020

(54) NON-VOLATILE IN-MEMORY COMPUTING DEVICE

(71) Applicant: GSI TECHNOLOGY INC., Sunnyvale, CA (US)

(72) Inventors: Avidan Akerib, Tel Aviv (IL); Eli Ehrman, Beit Shemesh (IL)

(73) Assignee: GSI Technology Inc., Sunnyvale, CA (US)

( * ) Notice: Subject to any disclaimer, the term of this patent is extended or adjusted under 35 U.S.C. 154(b) by 0 days.

(21) Appl. No.: 14/588,419

(22) Filed: Jan. 1, 2015

(65) Prior Publication Data

US 2015/0131383 A1 May 14, 2015

Related U.S. Application Data

(60) Provisional application No. 62/019,486, filed on Jul. 1, 2014.

(51) Int. Cl.
| | |
|---|---|
| *G11C 7/12* | (2006.01) |
| *G11C 16/10* | (2006.01) |
| *G11C 15/04* | (2006.01) |
| *G11C 8/10* | (2006.01) |
| *G11C 29/34* | (2006.01) |
| *G11C 13/00* | (2006.01) |

(52) U.S. Cl.
CPC ............... *G11C 7/12* (2013.01); *G11C 8/10* (2013.01); *G11C 13/0002* (2013.01); *G11C 15/043* (2013.01); *G11C 16/10* (2013.01); *G11C 29/34* (2013.01)

(58) Field of Classification Search
CPC ......... G11C 7/12; G11C 8/10; G11C 13/0002; G11C 15/043; G11C 16/10; G11C 29/34
See application file for complete search history.

(56) References Cited

U.S. PATENT DOCUMENTS

| | | | | |
|---|---|---|---|---|
| 6,781,896 B2* | 8/2004 | Lammers | ............... | G11C 29/70 |
| | | | | 365/158 |
| 7,016,222 B2* | 3/2006 | Morikawa | ............... | G11C 11/15 |
| | | | | 365/148 |
| 7,298,640 B2* | 11/2007 | Chen | ...................... | G11C 11/16 |
| | | | | 257/E27.004 |
| 7,542,326 B2* | 6/2009 | Yoshimura | ............... | G11C 11/22 |
| | | | | 365/148 |

(Continued)

*Primary Examiner* — Richard Elms
*Assistant Examiner* — R Lance Reidlinger
(74) *Attorney, Agent, or Firm* — Heidi Brun Associates Ltd.

(57) ABSTRACT

Disclosed is an in-memory computing device including a memory array with non-volatile memory cells arranged in rows and columns; a multiple row decoder to activate at least two cells in a column of the memory array at the same time to generate a parametric change in a bit line connected to at least one cell in the column; and circuitry to write data associated with the parametric change into the memory array. Additionally disclosed is a method of computing inside a memory array including non-volatile memory cells arranged in rows and columns, the method includes activating at least two cells in a column of the memory array at the same time to generate a parametric change in a bit line connected to at least one cell in the column; and writing data associated with the parametric change into the memory array.

4 Claims, 13 Drawing Sheets

(56) References Cited

U.S. PATENT DOCUMENTS

| | | | | |
|---|---|---|---|---|
| 8,238,173 B2* | 8/2012 | Akerib | ................... | G11C 29/34 |
| | | | | 365/189.07 |
| 8,587,986 B2* | 11/2013 | Kitagawa | ........... | G11C 13/0009 |
| | | | | 365/148 |
| 8,908,407 B1* | 12/2014 | Haukness | ............ | G11C 15/046 |
| | | | | 365/49.1 |
| 2015/0348624 A1* | 12/2015 | Jang | ..................... | G11C 13/004 |
| | | | | 365/148 |

* cited by examiner

Figure 2

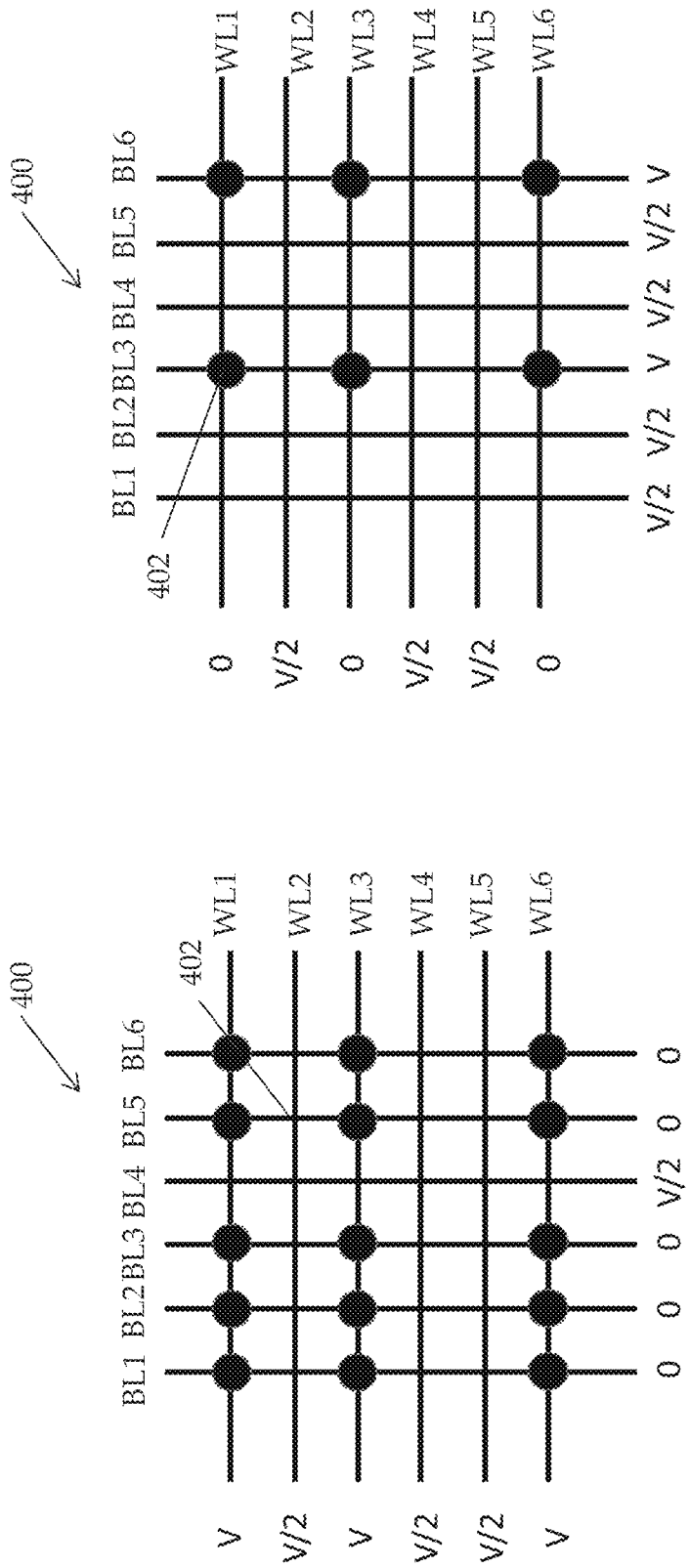

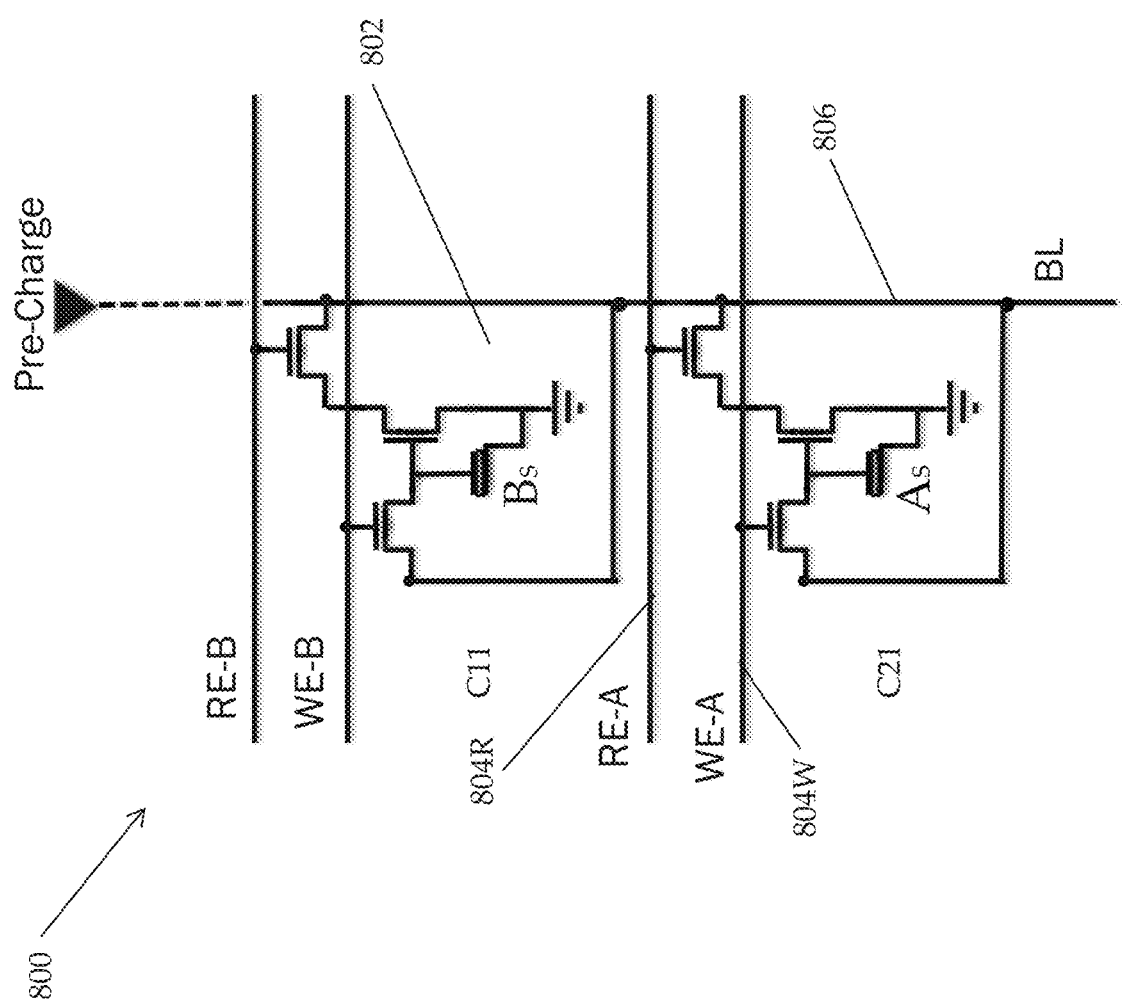

NON-VOLATILE IN-MEMORY COMPUTING DEVICE

CROSS-REFERENCE TO RELATED APPLICATIONS

This application claims benefit from U.S. Provisional Patent Application No. 62/019,486 filed 1 Jul. 2014, which is hereby incorporated in its entirety by reference.

FIELD OF THE INVENTION

The present invention relates to non-volatile memories generally, and to non-volatile memories used for search and/or computational operations in particular.

BACKGROUND OF THE INVENTION

Non-volatile memories are memories which retain stored data following removal of power, allowing the data to be retrieved when power is restored. They are particularly advantageous compared to volatile memories such as DRAM (dynamic random access memory) and SRAM (static random access memory) as the latter lose stored data when power is removed.

Flash memory is a type of non-volatile memory which may be found in most types of electronic devices including smart phones, personal computers, tablet computers, digital cameras, digital video/audio players, USB memory sticks, among other types of consumer devices. It may also be found in most types of industrial and scientific electronic devices (e.g. robotic devices, control devices, medical devices, etc.).

Flash memories typically employ NAND or NOR logic gates to implement the memory cells. NOR-based flash (NOR flash) memory may provide high-speed random access to specific locations within the memory, allowing data to be read from a single memory cell without having to access other cells. NAND-based flash (NAND flash), on the other hand, requires that data be read sequentially from a number of memory cells which are serially connected. This serial connection makes reading of NAND flash slower than NOR flash. On the other hand, an advantage is that it makes NAND flash comparatively less expensive to manufacture as a larger number of memory cells may be stored in a same-size chip (higher density chip).

Recent technological developments are leading to the use of other types of technologies in non-volatile memories. One type is the ReRAM (resistive random access memory), also known as RRAM, which is based on the use of a memristor which is a solid state device whose resistance is influenced by the amount of current which previously flowed through the device and a direction of the flow, and is therefore capable of remembering the last charge applied when power is removed. Other types of technologies include MRAM (magneto-resistive random access memory), PC-RAM (phase-change random access memory), STT-RAM (spin-transfer torque random access memory), non-volatile SRAM (nvSRAM), T-RAM (thyristor RAM), Z-RAM (zero-capacitor RAM), FeRAM (ferromagnetic RAM), PMC (programmable metallization cell), SONOS (Silicon-Oxide-Nitride-Oxide-Silicon), and NRAM (nano RAM), among others.

SUMMARY OF THE PRESENT INVENTION

There is provided, in accordance with an embodiment of the present invention, an in-memory computing device including a memory array having non-volatile memory cells arranged in rows and columns; a multiple row decoder to activate at least two cells in a column of the memory array at the same time to generate a parametric change in a bit line connected to at least one cell in the column; and circuitry to write data associated with the parametric change into the memory array.

According to an embodiment of the present invention, the at least one cell in the column comprises all the cells in the column.

According to an embodiment of the present invention, the at least one cell in the column is the first cell in the column.

According to an embodiment of the present invention, the last cell in the column is connected to a source line.

According to an embodiment of the present invention, the circuitry includes sensing circuitry to sense the parametric change.

According to an embodiment of the present invention, the circuitry includes a write unit to create a parametric change in one or more bit lines in the memory array to write the data into the array.

According to an embodiment of the present invention, the circuitry includes a controller to instruct the multiple row decoder to activate one or more rows in the memory array.

According to an embodiment of the present invention, the device additionally includes precharge circuitry to apply a precharge voltage to the bit line.

There is provided, in accordance with an embodiment of the present invention, a method of computing inside a memory array having non-volatile memory cells arranged in rows and columns, the method including: activating at least two cells in a column of the memory array at the same time to generate a parametric change in a bit line connected to at least one cell in the column; and writing data associated with the parametric change into the memory array.

According to an embodiment of the present invention, the method additionally includes connecting all the cells in the column to the bit line.

According to an embodiment of the present invention, the method additionally includes connecting only the first cell in the column to the bit line.

According to an embodiment of the present invention, the method additionally includes connecting a last cell in the column to a source line.

According to an embodiment of the present invention, the method additionally includes sensing the parametric change.

According to an embodiment of the present invention, the method additionally includes creating a parametric change in one or more bit lines in the memory array to write the data into the array.

According to an embodiment of the present invention, the method additionally includes instructing a multiple row decoder to activate one or more rows in the memory array.

According to an embodiment of the present invention, the method additionally includes precharging the bit line to a precharge voltage.

According to an embodiment of the present invention, the parametric change is any one of a change in voltage, current, resistance, and inductance.

According to an embodiment of the present invention, the non-volatile memory cells include any one of ReRAM cells, MRAM cells, STT-RAM cells, PC-RAM cells, nvSRAM cells, T-RAM cells, Z-RAM cells, FeRAM cells, PMC, SONOS cells, and NRAM cells.

According to an embodiment of the present invention, the memory array is a flash memory array.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates a truth table for implementing a full adder with the in-memory processor shown in FIGS. 1A and 1B;

FIGS. 7A and 7B schematically illustrate data writing into a section of the ReRAM array of FIG. 5B in an "Erase-Before-Reset" method of writing data back into the memory array, according to an embodiment of the present invention;

FIG. 12 schematically illustrates two exemplary single-sided 3T-SRAM cells of a single-sided 3T-SRAM array implementable in the in-memory processor shown in FIGS. 1A and 1B, according to an embodiment of the present invention.

Figure 1A:
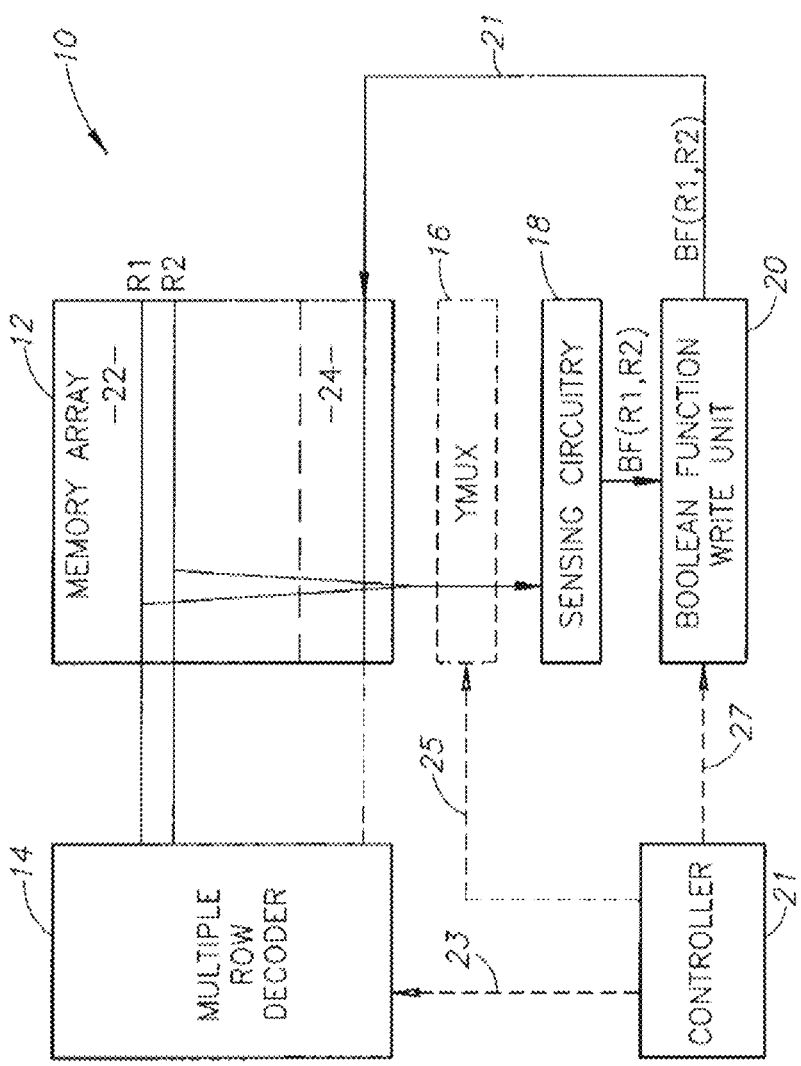
FIGS. 1A and 1B schematically illustrate an exemplary in-memory processor described in U.S. Pat. No. 8,238,173, assigned to the common assignee of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In U.S. Pat. No. 8,238,173 which is commonly assigned to the assignees of the present invention and incorporated herein in its entirety by reference, there is described an in-memory processor including a memory array which stores data, and an activation unit to activate at least two cells in a column of the memory array at generally the same time. The in-memory processor generates a Boolean function output of the data of the at least two cells.

Figure 1B:
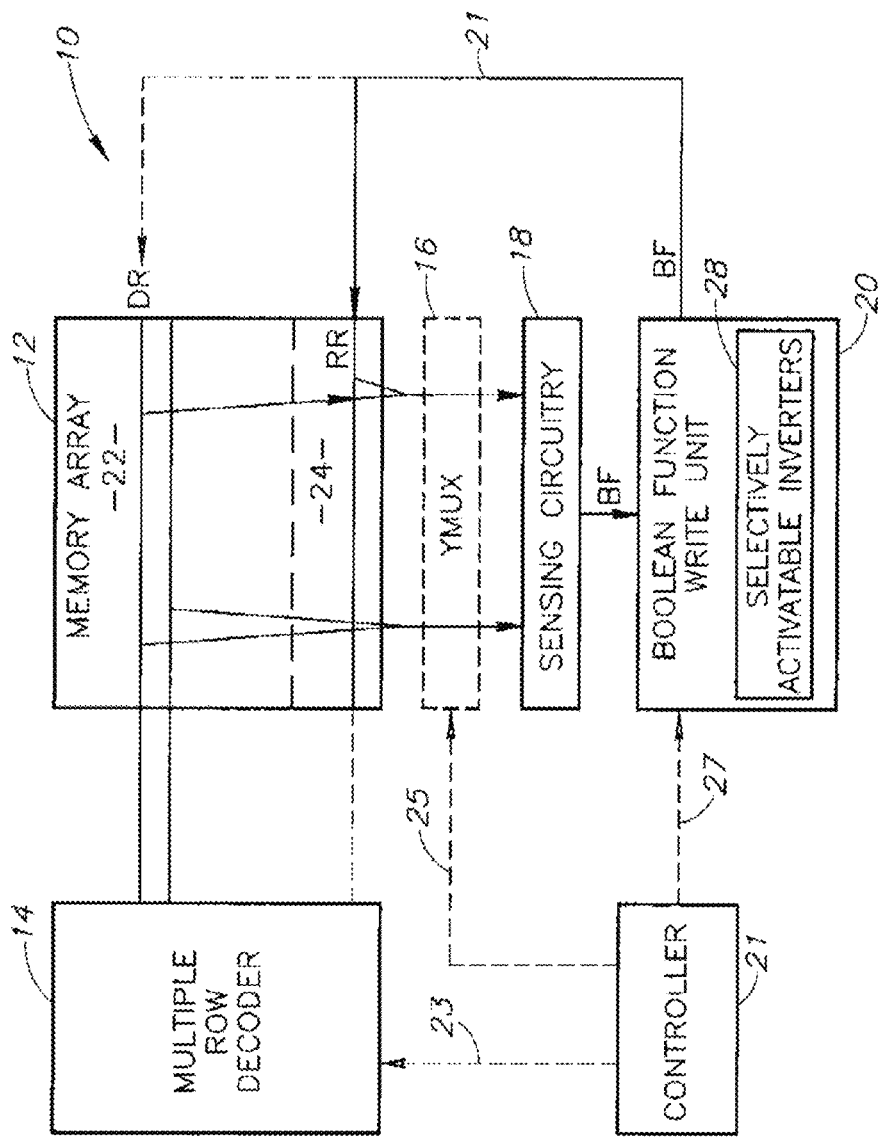

FIGS. 1A and 1B schematically illustrate the in-memory processor 10 described in U.S. Pat. No. 8,238,173. Processor 10 may comprise a memory array 12, a multiple row decoder 14, an optional YMUX 16, sensing circuitry 18, an output unit 20 and a controller 21. Memory array 12 may be any suitable memory array, volatile or non-volatile, such as a RAM, a DRAM, an SRAM, among others, which may be pure memory cells, designed to store data only and with no additional circuitry within array 12.

Memory array 12 may include multiple word lines defining rows, and multiple read lines and write lines defining columns. The read lines are connected on output to sensing circuitry 18. The memory cells in memory array 12 may be arranged in rows and columns, each cell formed at the intersection of a word line and a read line. Each memory cell in a column may be connected on input to the read line, so that the plurality of cells in the column is essentially connected in parallel to the read line in a NOR configuration.

Memory array 12 may be a single memory array or may be divided into two sections, a data section 22, in which the data may be stored, and a processing section 24, which may receive the results of various types of processing on the data of data section 22. For the examples of FIGS. 1A and 1B, memory array 12 will be assumed to be divided into the two sections 22 and 24.

Multiple row decoder 14 may be any suitable row decoder able to decode more than one row at a time, as described in more detail hereinbelow. For reading, row decoder 14 may activate two or more rows of memory array 12 at a time, for example rows R1 and R2. If all columns are to be processed at one time, in a massively parallel operation, then YMUX 16 is not necessary. However, if only some of the columns are to be processed, YMUX 16 may activate the selected read lines. Controller 21 may indicate to row decoder 14 which word lines to activate for the current operation. For operation on individual or selected columns, controller 21 may also indicate to YMUX 16 which read or write lines to activate.

Sensing circuitry 18 may be formed of any suitable sensing circuitry and may determine if the currently active read lines are discharged or not. Since row decoder 14 may have activated multiple rows, each read line will remain charged only if all of the activated memory cells connected in its column do not have a charge. If any of the activated memory cells in the column have a charge, the read line will be discharged. As may be appreciated, this is a natural NOR of the activated cells in the column only producing a signal when the cells are all 0s. While this realization may not be useful for determining the values of the stored data (since one cannot know which cell or cells were unchanged), it may be useful for implementing the kind of Boolean mathematics which is at the heart of all computing devices.

Thus, as mentioned, the output of each sensing circuit may be a Boolean function of the states of the memory cells in each column (the Boolean function may depend on how the data is perceived, for example, which state is considered the 0 state). Thus, if rows R1 and R2 of data section 22 were read out, sensing circuitry 18 may generate the Boolean function BF(R1,R2) of rows R1 and R2.

As also described above, write unit 20 may additionally include inverting circuitry to invert the Boolean function generated by sensing circuitry 18. Alternatively, the inverting circuitry may be included in sensing circuitry 18. Such inverters may be selectively operative, upon instructions from controller 21.

Controller 21 may indicate to the Boolean function write unit 20 to write the output of sensing circuitry 18 back into memory array 12, for example, into processing section 24. If the output was a discharge, then the write unit may discharge the cell being written. Conversely, if the output was a charge, then write unit 20 may charge the cell being written. In the example of processing rows R1 and R2, write unit 20 may write BF(R1,R2) into processing section 24.

For the cells of FIG. 1, to effect the write operation, controller 21 may indicate (dashed line 23) to row decoder 14 to activate the write enable WE word line for the desired row of processing section 24, to optional YMUX 16 (dashed line 25) to activate the appropriate write W lines (alternatively, all write lines W may be activated) and to write unit 20 (dashed line 27) to provide the BF(R1,R2) it received and, possibly, inverted. It will be appreciated that other types of cells may require other types of lines to be activated.

Computing memory unit 10 may perform Boolean operations on the data stored in memory array 12 and, when operating on many columns, may imitate a massively parallel processing unit, all without the use of a bus to move data from a memory unit to the processing unit. The computations occur within the memory array, as a result of the read operation. Thus, computing memory unit 10 may implement any Boolean gate, (NOR or otherwise), and any Boolean operation, on a single column, on multiple columns, or on all of the columns of the array, a massively parallel operation. Memory array 12 may be large, to implement massively parallel operations, or it may be a single column, to implement simple Boolean gates.

Multiple row decoder 14 may activate any sets of rows necessary. Some operations may require that only data rows (of data section 22) be activated while other operations may require that one or more of the rows to be activated be rows of processing section 24.

Standard row decoders activate a single row at a time. Multiple row decoder 14 may be formed from a combination of multiple row decoders. Alternatively, a multi-bit register, such as a 64-bit register, may be suitable. Such a register may store a pattern, where a bit value of 1 may activate a read enable word or a write enable word line.

In another embodiment described in U.S. Pat. No. 8,238, 173, write unit 20 may write over a row of data, and may include a selective write unit, such as is described in U.S. patent application Ser. No. 12/113,474 filed May 1, 2008 and assigned to the common assignees of the present application. Such a unit may generate tag flags for each cell, where a tag flag may be set to 1 when the output of write unit 20 is 1, and to 0 when the output is 0, or vice versa. The selective write operation may then activate only the write lines with a tag flag of 1 and may write either a 1 or a 0 to the cell, as appropriate.

In another embodiment described in U.S. Pat. No. 8,238, 173, write unit 20 may write more than one row of data when writing to memory array 12. Alternatively or in addition, write unit 20 may also write the complement of the result it received.

Figure 2:
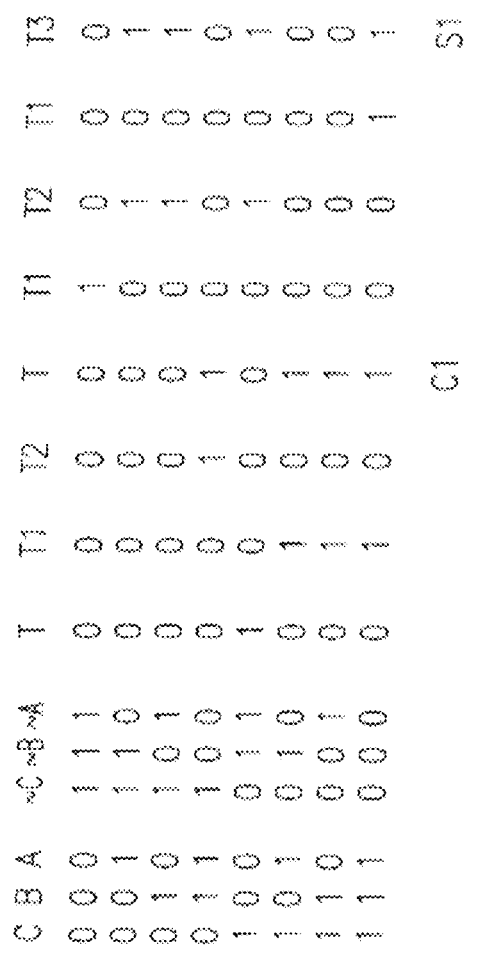

FIG. 2 illustrates a truth table for implementing a full adder (i.e. an adder capable of adding two bits A and B with a carry C from a previous operation) with in-memory processor 10 and described in U.S. Pat. No. 8,238,173. Bits A and B and carry C are stored in different rows of the same column. The columns A, B and C of FIG. 2 list the possible values that the inputs A and B and carry C can have. The columns ~C, ~B, and ~A of FIG. 2 list the complements of columns C, B and A. To generate the new carry C1, controller 21 may execute the following exemplary operations:

T=NOR (~C, A, B)
T1=NOR (~C, T)
T2=NOR(C, ~A, ~B)
C1=OR (T1, T2)

In other words, in the first cycle, ~C, A and B may be read from memory array 12 and then written back into T, typically located in processing section 24. In the second cycle, ~C and T may be read and then written into T1. In the third cycle, C, ~A and ~B may be read and then written into T2. Finally, to generate new carry C1 for the next operation, T1 and T2 may be read, inverted (to perform the OR operation) and then written into C1. Although FIG. 2 shows a truth table, and thus, the discussion above provides an explanation of the operation on single bits, it will be appreciated that the operations given above and below may be performed on single bits, multiple bits or entire rows of data, as instructed by controller 21. Each sensing circuitry receives the output of one calculation, which is the output of one column, and thus, operating on entire rows is a massively parallel operation.

To generate the new sum S1, controller 21 may execute the following exemplary operations:

T1=NOR(C, B, A)
T2=NOR (T1, T)
T1=NOR (~C, ~B, ~A)
S1=OR (T1, T2)

In other words, in the fifth cycle, C, B and A may be read from memory array 12 and then written back into T1. In the sixth cycle, T1 and T may be read and then written into T2. In the seventh cycle, ~C, ~B and ~A may be read and then written into T1. Finally, to generate new carry S1, T1 and T2 may be read, inverted and then written into S1. S1 and C1 may be stored in processing section 24 or in data section 22, as desired and instructed by controller 21.

The operations shown in FIG. 2 and discussed hereinabove are exemplary only; other series of Boolean operations may be performed to generate the same or similar results in more or fewer cycles. The invention may be used to replace any logic gate and/or a set of logic gates in standard circuitry. Moreover, it may implement massively parallel logic gates.

If the complement values have not already been stored, then a few cycles may be devoted to generating them. To generate complements, the data of interest may be read and inverted via the inverter(s) in write unit 20. The result may be written into processing section 24. A complement operation may be performed once and the complement data may be reutilized for as many operations as necessary.

The inverter may not be strictly required. An OR operation may be implemented by performing the NOR operation twice (since the single input NOR of a NOR is an OR). Thus, the data to be OR'd may be read and its NOR'd result written into cell(s) of the memory array 12 (with or without the selective write operation described hereinabove). The data of the processed cell(s) may then be read and the result may be the OR.

The selective write operation described hereinabove may also be implemented without any hardware. In the selective write described hereinabove as shown in FIG. 1B, a compare operation was performed between a data row DR and a result row RR where the purpose of the operation is to use the results in results row RR to determine which bits in data row DR to change, what value to change them to and which bits in data row DR to leave unchanged. Result row RR is typically the result of one or more Boolean functions performed on one or more rows.

Various operations may be performed on data row DR and result row RR, depending on the type of operation desired. For example, if it is desired to modify data row DR by writing a 1 in data row wherever there is a 1 in result row RR, controller 21 may instruct the operation of OR(RR,DR). To modify data row DR by writing a 1 wherever there is a 0 in result row RR, controller 21 may instruct the operation of OR(~RR,DR). Instructing AND(RR,DR) may write a 0 to data row DR wherever there was a 0 in result row RR and instructing AND(~RR,DR) may write a 0 to data row DR wherever there was a 1 in result row RR.

In the operations illustrated herein and in other operations necessary for a computing device, there are no cycles wasted in copying the data between registers and a processing unit and there is no bus to slow the operation down. Moreover, there is no processing device and thus, the real estate on a chip required to implement a computing system may be significantly smaller.

As described in U.S. Pat. No. 8,238,173, any memory array may be used which relies on line discharge to perform their read operation. Additionally, it may be possible to make bi-stable SRAM cells work with discharge. Furthermore, any memory array may be used which may produce a determinate result when multiple rows may be read together. It may be applicable to DRAM as well, although DRAM spills its charge out when read. The stored value is determinate, but the charge is removed upon reading. Accordingly, DRAM includes circuitry to restore the read row. However, this is only applicable where one row is read at a time. If multiple rows are read at one time, there is no way to restore the data.

When operating with DRAM and other memory array types which destroy the data upon reading, an AND gate may be added for each column of the memory array, to AND a column and the value stored in an output row, stored in write unit 20. Each row may be activated separately and its output read into the AND gates for the activated columns. The AND gates may AND the output of the cells, for all separately activated rows, holding the result between activation of the rows. The output row may be refreshed at the end of each operation. For this embodiment, the array may perform the AND operation, rather than the NOR operation. Alternately, multiple rows can be read but then the original data is lost. This technique is restricted to situations where loss of data is acceptable or if the data about to be destroyed is first copied to a different location for future use.

In a further embodiment, sensing circuitry 18 may be unnecessary. Row decoder 14 may activate multiple rows for reading and may activate a row for writing at generally the same time. This is particularly apt for 3T DRAM cells, which have separate read and write enable lines and separate read and write column lines. Write unit 20 may initially activate the read lines and then may activate the write lines. Accordingly, other embodiments may use a modified 3T cell where the read and write lines are merged into a single line.

Applicants have realized that the principles of operation of the in-memory processor described in U.S. Pat. No. 8,238,173, including the method of performing in-memory computations without having to move data out of the memory over a bus to a processing unit as is typically done in the art, may be suitably adapted to non-volatile memory (NVM) arrays, including flash memory arrays. The NVM arrays may include any type of non-volatile memory (NVM) cell, that is, a memory cell which retains its charge following removal of power. Examples of these non-volatile cells may include ReRAM cells, MRAM cells, STT-RAM cells, PC-RAM cells, nvSRAM cells, T-RAM cells, Z-RAM cells, FeRAM cells, PMC, SONOS cells, NRAM cells, among other NVM cells and memristor devices known in the art, or which may be under development, or yet to be developed. The cells may be arranged in the memory array in a configuration resembling a NOR-type configuration as shown in FIG. 3, or a NAND-type configuration as shown in FIG. 4, and described in more detail further on below.

Applicants have further realized that, in some embodiments, as data may be rewritten many times into a same NVM cell (i.e. read/write cycle typically in the order of $10^8$ or greater) the in-memory processor having a memory array of NVM cells does not require the processing section (i.e. processing section 24 in U.S. Pat. No. 8,238,173). An exception may be when the memory array includes floating gate NVM cells or other types of flash memory cells, in which case the processing section may be required if rewriting of data (processed data) into memory is desired so as to not affect endurance of the flash memory cells which is typically in the order of $10^5$-$10^6$ read/write cycles. In these cases, the processing section may be implemented using SRAM cells. Nevertheless, should technological advancements increase the endurance of flash memory cells, for example, to a same order of magnitude of the other type of NVM cells, rewriting processed data back into the flash memory without use of the processing section may certainly be feasible. Notwithstanding the relative low endurance of the flash memory cells compared with the other NVM cells, the flash memory cells (as well as the other NVM cells) may be well suited for use in the memory array of a CAM (content-addressable memory) unit or a TCAM (ternary-CAM) unit as described in U.S. Pat. No. 8,238,173.

NOR-Type NVM Array

Figure 3:
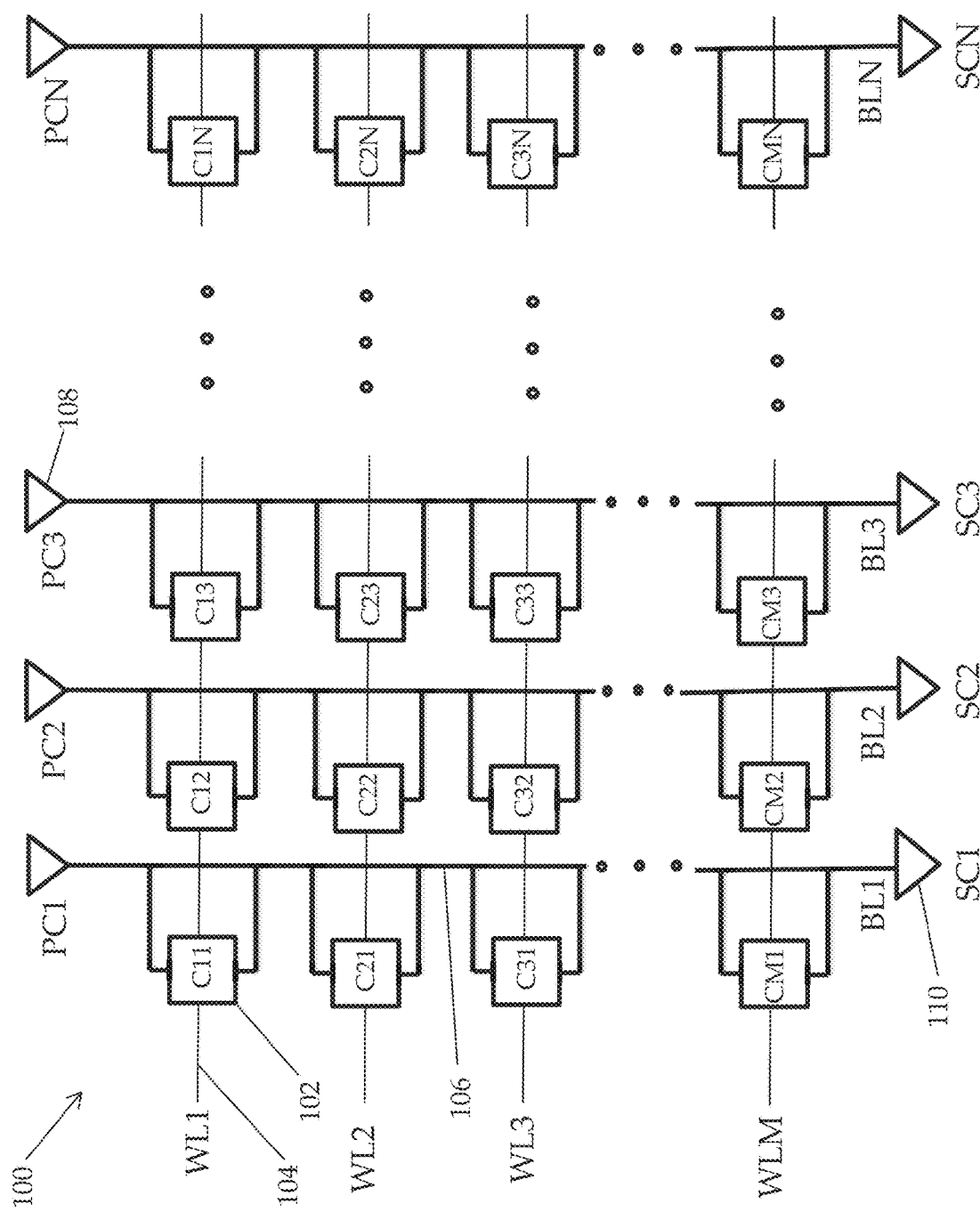
FIG. 3 schematically illustrates an exemplary non-volatile memory (NVM) array including a plurality of NVM cells arranged in M rows and N columns in a NOR-type architecture, and implementable in the in-memory processor shown in FIGS. 1A and 1B, according to an embodiment of the present invention.
Figure 4:
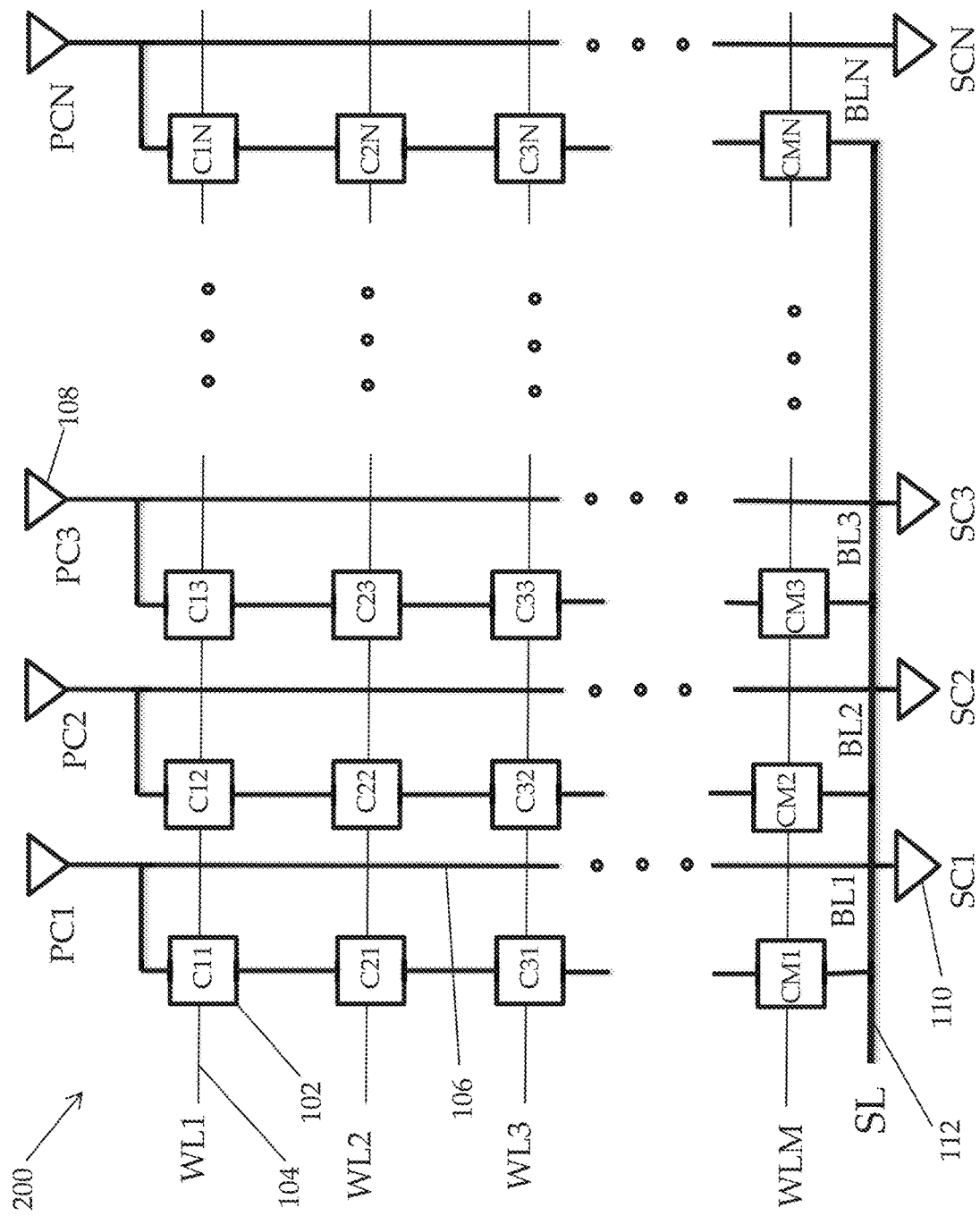
FIG. 4 schematically illustrates an exemplary non-volatile memory (NVM) array including a plurality of NVM cells arranged in M rows and N columns in a NAND-type architecture, and implementable in the in-memory processor shown in FIGS. 1A and 1B, according to an embodiment of the present invention.

Reference is now made to FIG. 3 which schematically illustrates an exemplary non-volatile memory (NVM) array 100 including a plurality of NVM cells 102 arranged in M rows and N columns, and implementable in in-memory processor 10 shown in FIGS. 1A and 1B, according to an embodiment of the present invention. NVM array 100 may be used for performing in-memory computations and may allow, in some embodiments, rewriting of processed data back into memory cells 102, for example, as described with reference to FIG. 2. In some embodiments, memory array 100 may be implementable in a CAM unit or a T-CAM unit, for example as also described in U.S. Pat. No. 8,238,173.

The architecture of NVM array 100 may resemble that of a flash NOR-type memory array, each NVM cell 102 connected to a read bit line 106. NVM cells 102 may each be identified by the letter "C" followed by the row and column in which it is located on the array. For example, cells 102 in the first row and located in the 1 to Nth column are designated C11, C12, C13, to C1N, respectively. Similarly cells 102 located in the second row and third row, as shown, are designated C21, C22, C23, to C2N, and C31, C32, C33, to C3N, respectively. Cells 102 in the Mth row are designated CM1, CM2, CM3, to CMN, respectively.

Each cell 102 in a row may be connected to a word line 104 which may be connected to a multiple row decoder, for example multiple row decoder 14 shown in FIGS. 1A and 1B, and through which each cell in the row may be activated. Each word line 104 is identified by the row of cells it activates, for example WL1 activates the cells in the first row, WL2 and WL3 the cells in the second and third rows, respectively, and so forth with WLM activating the cells in the Mth row. Each word line 104 may include single or multiple write enabling and read enabling lines to allow writing and reading to each cell in its respective row.

Each cell 102 in a column may be connected to a read bit line 106, the bit line connecting the cells in the first column designated BL1, in the second column and the third columns BL2 and BL3, respectively, and so on to BLN in the Nth column. Bit lines 106 may be connected at one end to a precharge circuit which may apply a precharge voltage to each bit line, and at another end to a sense circuit, for example, to sensing circuitry 18 shown in FIGS. 1A and 1B, to sense an electrical or magnetic parameter e on the bit lines. These electrical or magnetic parameters may include voltage, current, resistance, or inductance, or other parameters which may be indicative of an electrical or magnetic condition existing on the bit line. Sensing circuitry 18 may also sense a parametric change on the bit line associated with a change in any one of the electrical or magnetic parameters of the bit line. The connection of each bit line to the precharge circuit is shown by PC connections 108, the PC connection for BL1 designated PC1, those for BL2 and BL3 designated PC2 and PC3, respectively, and so on to PCN to designate the PC connection for BLN. Similarly, the connection of each bit line to the sensing circuit is shown by SC connection 110, the SC connection for BL1 designated SC1, those for BL2 and BL3 designated SC2 and SC3, respectively, and so on to SCN to designate the SC connection for BLN. Each cell 102 in a column may also be connected to a write bit line not shown in the figure, or alternatively, bit line 106 may also be used as a write bit line. Optionally, each NVM cell 102 in a column may also be connected to a source line (not shown) which may be connected to ground or other voltage potential, establishing a voltage potential across the cell.

In an exemplary mode of read operation in NVM array 100, bit lines 106 may be charged to a precharged voltage. When a word line 104 in a row is activated in a read mode, each cell 102 in the row, depending on whether or not it contains a charge, may conduct and may provide a path to discharge the respective bit line 106 to which it is connected to ground, or alternatively, may provide a resistive connection to the optional source line. It may also be possible, as previously mentioned if the cell contains a charge or not, that cell 102 may not conduct and may not affect the precharged voltage on the respective bit line to which it is connected. For example, activation of WL2 may cause C21 (closed circuit) to discharge BL1 to ground or to provide a resistive conductive path to the optional source line, or otherwise, C21 may act as an open circuit and BL1 remains precharged, depending on whether the NVM cell contains a charge or not, and depending on the NVM technology. The charge state of BL1 may be sensed by sensing circuit 18 which may be interpreted as a logical "1" or a logical "0" depending on the voltage on the bit line. It may be appreciated in NVM array 100, and with reference to all memory arrays described hereinafter, that use of logic "1" and logic "0" may be a matter of definition, and may be used interchangeably so long as their definitions are maintained within the operation of the memory array. It may also be appreciated that it may be enough for only one NVM cell 102 in a column to cause the respective bit line 106 to change its voltage from the precharged voltage for the change to be sensed by the sensing circuit (i.e. NOR Boolean operation). Word lines 104 may be activated one at a time or more than one at a time, for example, two at a time, three at a time, ten at a time, fifteen at a time, fifty at a time, one hundred at a time, five hundred at a time, or more.

Writing back data into NVM array 100, as previously described with reference to FIGS. 1A and 1B, may include use of write unit 20 and controller 21, or alternatively, may include use of only controller 21 to instruct multiple row decoder 23 to activate the respective word lines 104 in the write mode to write the bit line data into the respective cells 102 into which the data is to be written (data-receiving cells).

The architecture of NVM array 100 may be suitably used with NVM technologies such as ReRAM, MRAM, STT-RAM, T-RAM, PC-RAM, nvSRAM, among others. A more detailed explanation of the operation of NVM arrays using some of these NVM technologies is described further on below.

NAND-Type NVM Array

Reference is now made to FIG. 4 which schematically illustrates an exemplary non-volatile memory (NVM) array 200 including the plurality of NVM cells 102 arranged in M rows and N columns, and implementable in in-memory processor 10, according to an embodiment of the present invention. Similarly to NVM array 100, NVM array 200 may be used for performing in-memory computations and may allow, in some embodiments, rewriting of the processed data back into memory cells 102. Similarly to NVM array 100, in some embodiments, memory array 200 may be implementable in the CAM unit or the T-CAM unit.

The architecture of NVM array 200 may resemble that of a flash NAND-type memory array where NVM cells 102 in the first row are each connected to a read bit line 106 and all the cells below the first cell in each column are serially connected to each other in a "daisy chain" fashion. In the last row, each NVM cell 102 in each column is connected to the cell above it on one side and to a source line 112 designated SL, on the other. For example, referring to the first column, C11 is connected to BL1 on one side and on the other side to C21 which is connected on the other side to C31 which is connected on the other side to the following NVM cell and so on until connecting to CM1, which connects on the other side to SL which may in turn connect to ground or to another predetermined voltage. Similarly to NVM array 100, each row in NVM array 200 is connected to a word line 104 (WL1, WL2, WL3, to WLM), each read bit line 106 is connected on one end to the precharge circuit through PC connections 108 (PC1, PC2, PC3, to PCN) and on the other end to sensing circuit 18 through SC connections 110 (SC1, SC2, SC3, to SCN). Each NVM cell 102 in a column may also be connected to a write bit line not shown in the figure.

In an exemplary mode of read operation in NVM array 200, bit lines 106 are charged to a precharged voltage and source line 112 is connected to ground. When word lines 104 (WL1-WLM) are activated in a read mode, each NVM cell 102 in each row, depending on whether or not it contains a charge or on the amount of charge it contains, may conduct (substantially resembling a short circuit), or otherwise may not conduct (resembling an open circuit). Word lines 104 may be activated one at a time or more than one at a time, for example, two at a time, three at a time, ten at a time, fifteen at a time, fifty at a time, one hundred at a time, five hundred at a time, or more. For example, activation of WL1 to WLM may cause one or more of C11-CM1 to either conduct or not conduct. If any one of C11-CM1 does not conduct, BL1 is disconnected from SL and remains in the charged state. If all of NVM cells 102 in a column, for example C11-CM1 conduct, BL1 discharges to ground. The charge state of BL1 may be sensed by sensing circuit 18 which may be interpreted as a logical "1" or a logical "0" depending on the voltage on the bit line. It may be appreciated that all NVM cells 102 in a column are required to be in a conducting state for the change to be sensed by the sensing circuit (i.e. NAND Boolean operation).

Writing back data into NVM array 200, as previously described with reference to FIGS. 1A and 1B, may include use of write unit 20 and controller 21, or alternatively, may include only use of controller 21 to instruct multiple row decoder 23 to activate the respective word lines 104 in the write mode to allow writing the bit line data into the data-receiving cells 102. In NVM array 200, writing the data into the data-receiving cells may require activating word lines 104 connected to non-data receiving cells in the same column so that the non-data receiving cells conduct.

The architecture of NVM array 200 may be more suitable for NVM technologies such as floating gate NVM cells and other flash memory NVM cells. A more detailed explanation of the operation of NVM arrays using some of these NVM technologies is described further on below.

ReRAM Array

Figures 5A, 5B:
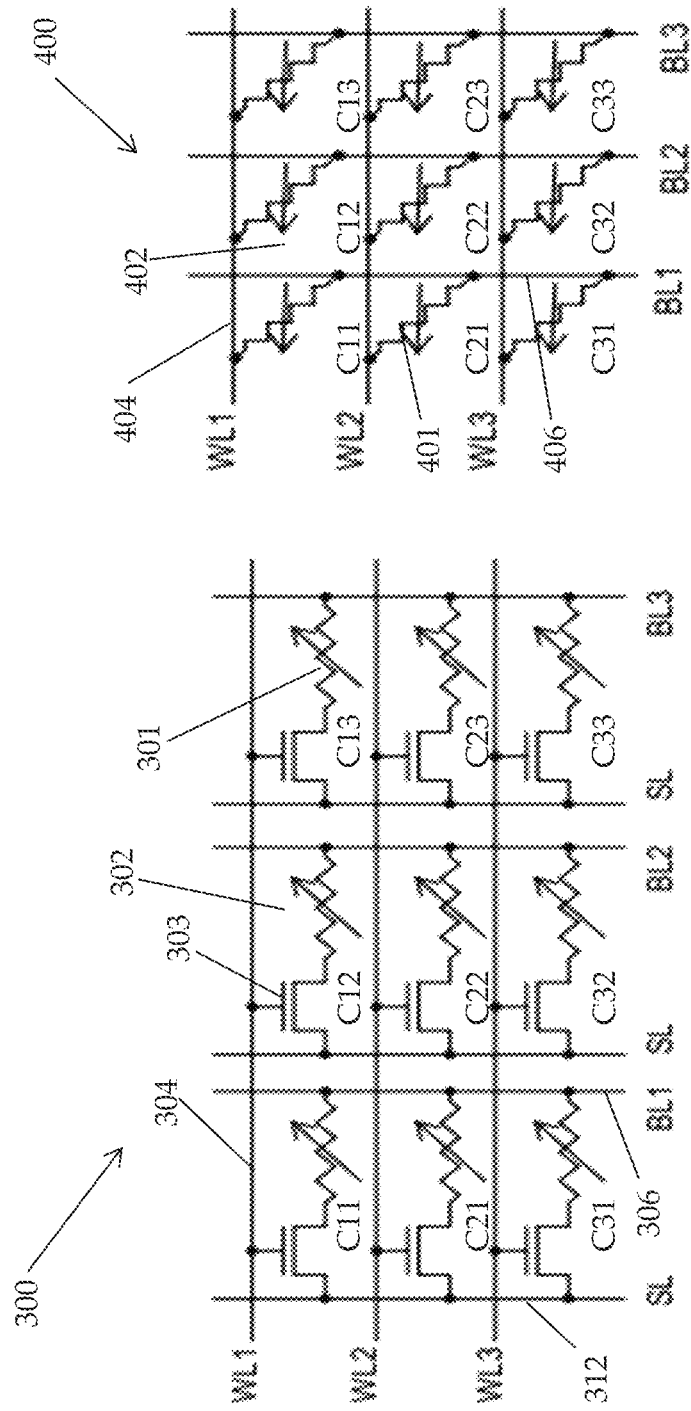
FIG. 5A schematically illustrates a section of an exemplary ReRAM array implementable in the in-memory processor shown in FIGS. 1A and 1B, according to an embodiment of the present invention.
FIG. 5B schematically illustrates a section of another exemplary ReRAM array implementable in the in-memory processor shown in FIGS. 1A and 1B, according to an embodiment of the present invention.

Reference is now made to FIG. 5A which schematically illustrates a section of an exemplary ReRAM array 300 implementable in in-memory processor 10 shown in FIGS. 1A and 1B, according to an embodiment of the present invention. Similarly to NVM array 100, ReRAM array 300 may be used for performing in-memory computations and may allow, in some embodiments, rewriting of the processed data back into memory cells 302. Similarly to NVM array 100, in some embodiments, ReRAM array 300 may be implementable in the CAM unit or the T-CAM unit. In some embodiments, ReRAM array 300 may be implementable in the architecture of NVM array 100.

ReRAM array 300 may include a plurality of ReRAM cells 302 arranged in rows and columns, each cell having a 1T1R architecture (one resistor 301 and one access transistor 303). For exemplary purposes, nine cells 302 are shown and designated C11, C12, and C13 in the first row; C21, C22, and C23 in the second row; and C31, C32, and C33 in the third row. Each column of cells 302 is connected to a bit line 306 on one side through resistor 301, and on the other side to a source line 312 through transistor 303. For example, in the first column, C11, C21, and C31 are connected on one side to a bit line 306 designated BL1 and on the other side to SL; in the second column, C12, C22, and C32 are connected on one side to a bit line 306 designated BL2 and on the other side to SL; and in the third column, C13, C23, and C33 are connected on one side to a bit line 306 designated BL3 and on the other side to SL. Additionally, each row of cells 302 is connected to a word line 304 which activates the cells in each row through access transistor 303, and which are respectively designated WL1 for the first row, WL2 for the second row, and WL3 for the third row. For example, WL1 activates C11, C12, and C13; WL2 activates C21, C22, and C23; and WL3 activates C31, C32, and C33. It may be appreciated that it may be possible, in some embodiments, to invert the connections of ReRAM cell 302 so that transistor 303 may connect to bit line 306 and the resistor to source line 312.

In an exemplary read mode of operation of ReRAM array 300, bit lines 306 in one or more columns containing ReRAM cells 302 to be read are discharged to 0 V or other substantially low voltage, for example to read C11 and C31, BL1 in column 1 is discharged. Word lines 304 connecting the rows containing ReRAM cells 302 to be read are then activated, for example WL1 and WL3 connecting to C11 and C31 may be set to a relatively high voltage, which may be supply voltage Vdd, to activate transistors 303. To perform the actual reading, SL may be set to a relatively high voltage sufficient to have a resistance voltage sensed on BL1, for example it may also be set to the supply voltage Vdd. The sensed voltage may then be decoded to a logical "1" or a logical "0" (e.g., above a certain predetermined value the sensed voltage may be a logical "1" and below the value a logical "0, or the inverse). In some embodiments, a voltage drop across the read ReRAM cells 302 (e.g. C11 and C31) may be sensed and decoded in a qualitative manner such as, for example, more "1" than "0", which may have many practical applications, including for potentially implementing a full adder.

It may be appreciated by the person skilled in the art, that bit line sensing may not be limited to voltage changes but, in general, to parametric changes as previously mentioned. These may include electrical or magnetic parametric changes, and which may include, aside from changes in voltage, changes in current flow through the bit line, changes in the bit line resistance, and changes in bit line inductance, among other parametric changes.

Writing back data into ReRAM array 300, as previously described with reference to FIGS. 1A and 1B, may include use of write unit 20 and controller 21, or alternatively, may include only use of controller 21 to instruct multiple row decoder 14 to activate the respective word lines 304 in the write mode to allow writing the bit line data into the data-receiving cells 102.

In some embodiments, a logical "0" may be written into ReRAM cells 302 by activating the respective word lines 304 connecting to the rows having the data-receiving cells, and setting SL to a relatively high voltage, such as Vdd/2, and the bit lines 306 connecting to the data-receiving cells to 0V or other relatively low voltage. A logical "1" may be written by setting the voltage on the respective bit lines 306 to a higher voltage which may be Vdd. For example, to rewrite the processed data resulting from reading C11 and C31 into C22, say "0", WL2 is activated in the write mode, BL2 is set to 0V and SL is set to Vdd/2, and to write "1", WL2 is activated in the write mode, BL2 is set to Vdd and SL is set to Vdd/2.

In some embodiments, writing back data into ReRAM array 300 may be performed without use of the sensing circuit. Referring to the previous example of writing the data back into C22, the following steps may be performed: (1)

precharge BL2 to a relatively high voltage (e.g. Vdd); (2) set SL to 0V or to other suitable low voltage; (3) activate WL2 for a very short duration; (4) following short duration activation of WL2, activate another word line 304 (e.g. WL3); (5) set SL to the relative higher voltage, e.g. Vdd/2.

Reference is now made to FIG. 5B which schematically illustrates a section of an exemplary ReRAM array 400 implementable in in-memory processor 10 shown in FIGS. 1A and 1B, according to an embodiment of the present invention. Similarly to NVM array 100, ReRAM array 400 may be used for performing in-memory computations and may allow, in some embodiments, rewriting of the processed data back into memory cells 402. Similarly to NVM array 100, in some embodiments, ReRAM array 400 may be implementable in the CAM unit or the T-CAM unit. In some embodiments, ReRAM array 400 may be implementable in the architecture of NVM array 100.

ReRAM array 400 may include a plurality of ReRAM cells 402 arranged in rows and columns, each cell having a 0T1R architecture (no transistor, one resistor 401). For exemplary purposes, nine ReRAM cells 402 are shown and designated C11, C12, and C13 in the first row; C21, C22, and C23 in the second row; and C31, C32, and C33 in the third row. Each column of ReRAM cells 402 is connected to a bit line 406 on one side of resistor 401 in each cell. For example, in the first column, C11, C21, and C31 are connected on one side to a bit line 406 designated BL1; in the second column, C12, C22, and C32 are connected on one side to a bit line 406 designated BL2; and in the third column, C13, C23, and C33 are connected on one side to a bit line 406 designated BL3. Additionally, each row of cells 402 is connected to a word line 404 on the other side of resistor 401 in each cell. Word lines 404 activate the cells in each row and are respectively designated WL1 for the first row, WL2 for the second row, and WL3 for the third row. For example, WL1 activates C11, C12, and C13; WL2 activates C21, C22, and C23; and WL3 activates C31, C32, and C33.

In an exemplary read mode of operation of ReRAM array 400, bit lines 406 in one or more columns containing ReRAM cells 402 to be read ("selected" bit lines) are discharged to 0 V or other substantially low voltage, and bit lines 406 not selected for reading ("unselected" bit lines) are charged to a relatively higher voltage, e.g. Vdd/2. As an example to read C11 and C13, BL1 in column 1 is discharged to 0V and BL2 and BL3 are charged to Vdd/2. Word lines 404 connecting the rows containing ReRAM cells 402 to be read ("selected" word lines) are then activated setting them to a relatively high voltage, which may be Vdd, while setting the voltage on word lines 404 of cells 402 which are not to be read ('unselected" word lines) to a lower voltage, which may be Vdd/2. As an example WL1 and WL3 connecting to C11 and C31 may be set to Vdd while WL2 may be set to Vdd/2. A voltage may then be sensed on BL1. The sensed voltage may be decoded to a logical "1" or a logical "0" (e.g., above a certain predetermined value or threshold, the sensed voltage may be a logical "1" and below the value a logical "0, or alternatively the inverse). In some embodiments, voltages at the threshold values may be decoded based on predetermined criteria, to either a "0" or a "1". In some embodiments, a the voltage on the bit line (e.g. C11 and C31) may be sensed and decoded in a more qualitative "priority vote" manner such as, for example, more "1" than "0", which may have many practical applications, including for implementing a full adder. As previously mentioned with respect to ReRAM array 300, it may be appreciated by the person skilled in the art that bit line sensing may not be limited to voltage changes but, in general, to parametric changes.

Writing back data into ReRAM array 400, as previously described with reference to FIGS. 1A and 1B, may include use of write unit 20 and controller 21, or alternatively, may include only use of controller 21 to instruct multiple row decoder 14 to activate the respective selected word lines 404 in the write mode, and additionally to activate the unselected word lines 404, to allow writing the bit line data into the data-receiving cells 402.

In some embodiments of the present invention, processed data may be written back into cells 402 in ReRAM array 400 using any one of the following two-step methods described below with respect to FIGS. 6A and 6B, and 7A and 7B, respectively. Cells 402 are schematically represented in the figures by the intersections of rows associated with word lines WL1-WL6, with columns associated with bit lines BL1-BL6 in memory array 400.

Figures 6A, 6B:
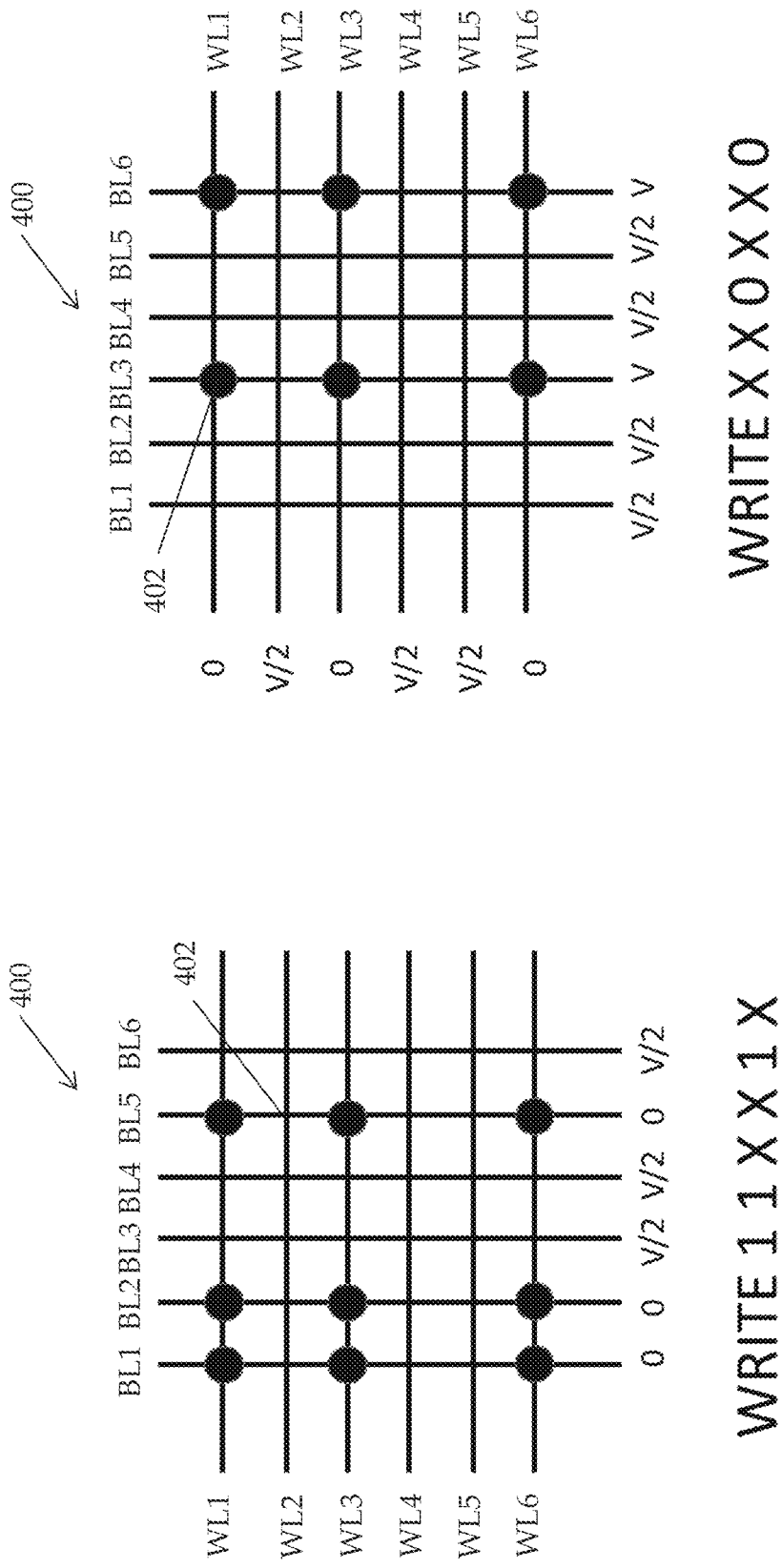
FIGS. 6A and 6B schematically illustrate data writing into a section of the ReRAM array of FIG. 5B in a "Set-Before-Reset" method of writing data back into the memory array, according to an embodiment of the present invention.

In the first method, which may be referred to as "Set-Before-Reset" method and described herein with reference to FIGS. 6A and 6B, in the first step, "1" is written into the respective memory cells 402 by selecting the respective word lines and bit lines, while leaving the other word lines and bit lines unselected. In the second step, "0" is written into the respective memory cells 402 by selecting the respective word lines and bit lines, while leaving the other word lines and bit lines unselected.

As an example, to write input data "110X10" to into rows 1, 3, and 6 in the memory array, where "X" is a bit having a "don't care" value and may be associated with an unselected bit line, the following steps may be followed. In the first step "11XX1X" is written into the array by setting WL1, WL3, and WL6 to V (a relatively high voltage); WL2, WL4 and WL5 to V/2; BL1, BL2, and BL5 to 0V; and BL3, BL4, and BL6 to V/2; as shown in FIG. 6A. In the second step, "XX00X0" is written into the array by setting WL1, WL3, and WL6 to 0V; WL2, WL4 and WL5 to V/2; BL1, BL2, and BL5 to V/2; and BL3 and BL6 to V; as shown in FIG. 6B. BL4 may be left at V/2 in both steps as the bit in the input data is a "don't care" bit.

In the second method, which may be referred to as "Erase-Before-Reset" method and described herein with reference to FIGS. 7A and 7B, in the first step, "1" is written into memory cells 402 in selected rows by selecting the respective word lines and by selecting all the bit lines except those associated with "don't care" bits in the selected rows; the other word lines are left unselected. In the second step, "0" is written into the respective memory cells 402 by selecting the respective word lines and bit lines, while leaving the other word lines and bit lines unselected.

As an example, to write input data "110X10" to into rows 1, 3, and 6 in the memory array, in the first step "111X11" is first written into the array by setting WL1, WL3, and WL6 to V (a relatively high voltage); WL2, WL4 and WL5 to V/2; BL1, BL2, BL3, BL5, and BL6 to 0V; and BL4 to V/2; as shown in FIG. 7A. In the second step, "XX00X0" is written into the array by setting WL1, WL3, and WL6 to 0V; WL2, WL4 and WL5 to V/2; BL1, BL2, BL4 and BL5 to V/2; and BL3 and BL6 to V; as shown in FIG. 7B. BL4 may be left at V/2 in both steps as the bit in the input data is a "don't care" bit.

ReRAM CAM/T-CAM

Reference is now made to FIGS. 8A-8E which schematically illustrate several exemplary CAM and T-CAM operations performed using two cells 402 (C11 and C21) in ReRAM array 400, according to an embodiment of the present invention. It may be appreciated that C11 and C21 may form a CAM cell or alternatively, a T-CAM cell. It may be further appreciated that, although C11 and C21 are shown in adjacent rows and sequentially following each other in the same column, this is only for exemplary purposes and in practical applications, the CAM/T-CAM cell may be formed by cells which may be distanced one from the other by two or more rows (in the same column).

In FIGS. 8A-8E, the values assigned to each cell may represent a charge state so that the value "0" may be associated with logical "0" and no charge in the cell and the value "1" may be associated with logical "1" and a charge in the cell. For example, C11=0 refers to C11 having no charge (storing a "0") and C11=1 refers to the cell having a charge (storing a "1").

C11 and C21 may work together to perform CAM/T-CAM operations, with data stored in the cells corresponding to the following truth table: 01=1, 10=0, and 00=X (don't care). The KEY includes the original value and its complement, so that if the original value is a "0", its complement is a "1" and the Key=01, where "0" is associated with an unselected WL (0v) and "1" with a selected WL (Vdd). To perform the CAM/T-CAM operations, BL1 is discharged to ground (0V).

Figures 8A, 8B, 8C, 8D, 8E:
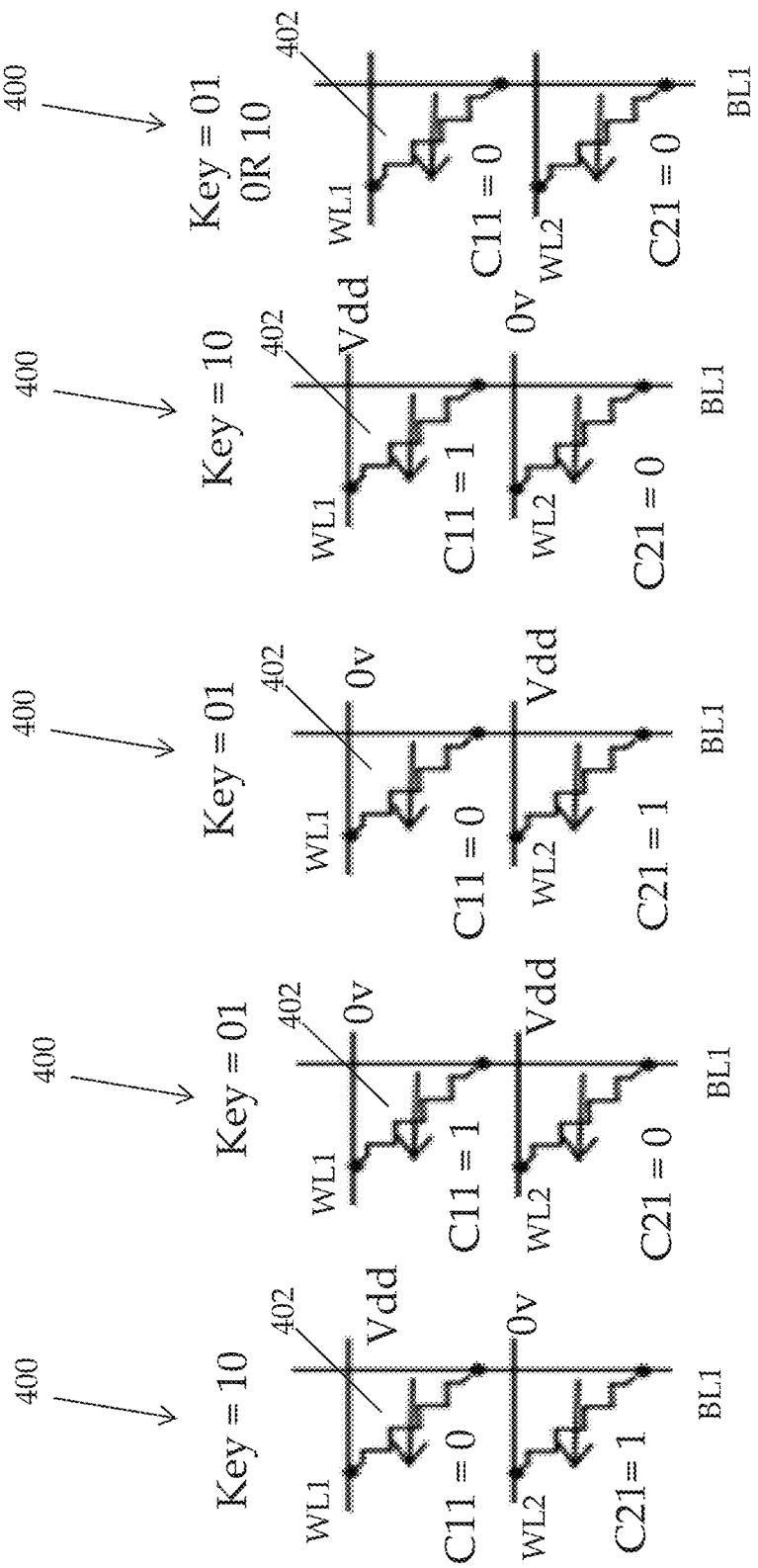
FIGS. 8A-8E schematically illustrate several exemplary CAM and T-CAM operations performed using two cells in the ReRAM array shown in FIG. 5B, according to an embodiment of the present invention.

Referring to FIG. 8A, the Key=10 so that WL1 is activated to Vdd and WL2 is unselected (0v). WL1=1 and C11=0 so there is current flow through C11 and a voltage threshold may be sensed at BL1. WL2=0 and C21=1 so there is no current flow through C21. Sensing of the voltage threshold in BL1 due to C11 indicates a Key match.

Referring to FIG. 8B, the Key=01 so that WL1 is unselected and WL2 is activated (selected). WL1=0 and C11=1 so there is no current flow through C11. WL2=1 and C21=0 so there is current flow through C21 and a voltage threshold may be sensed at BL1. Sensing of the voltage threshold in BL1 due to C21 indicates a match.

Referring to FIG. 8C, the Key=01 so that WL1 is unselected and WL2 is activated. WL1=0 and C11=0 so there is no current flow through C11. WL2=1 and C21=1 so there is no current flow through C21. There is no sensing of a voltage threshold on BL1 and therefore there is no Key match.

Referring to FIG. 8D, the Key=10 so that WL1 is activated and WL2 is unselected. WL1=1 and C11=1 so there is no current flow through C11. WL2=0 and C21=0 so there is no current flow through C21. There is no sensing of a voltage threshold on BL1 and therefore there is no Key match.

Referring to FIG. 8E, the Key=01 or 10 so that WL1 is unselected and WL2 is activated or the inverse. C11=0 and C21=0, which represents the "don't care" state. There will be current flow through one of C11 or C21, regardless of whether the Key=01 or 10, and a voltage threshold may be sensed at BL1, indicative of a Key match.

MRAM/STT-RAM Array

Figure 9:
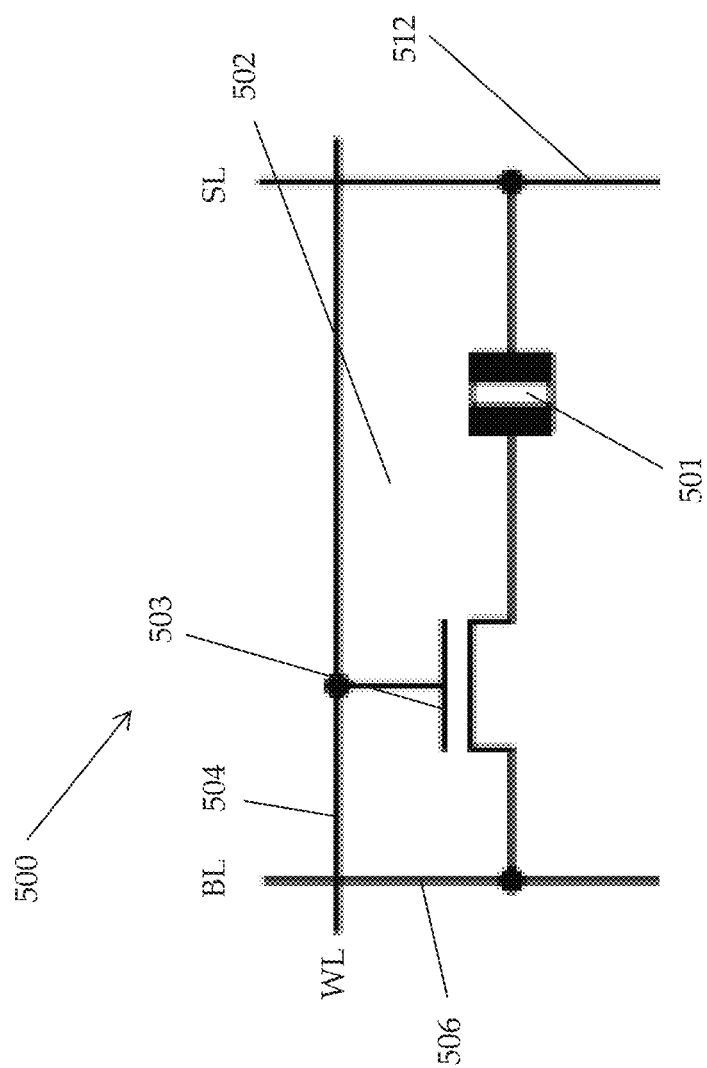
FIG. 9 schematically illustrates an exemplary MRAM cell of an MRAM array implementable in the in-memory processor shown in FIGS. 1A and 1B, according to an embodiment of the present invention.

Reference is now made to FIG. 9 which schematically illustrates an exemplary MRAM cell 502 of an MRAM array 500 implementable in in-memory processor 10 shown in FIGS. 1A and 1B, according to an embodiment of the present invention. Similarly to NVM array 100, MRAM array 500 may be used for performing in-memory computations and may allow, in some embodiments, rewriting of the processed data back into MRAM cells 502. Similarly to NVM array 100, in some embodiments, MRAM array 500 may be implementable in the CAM unit or the T-CAM unit. In some embodiments, MRAM array 500 may be implementable in the architecture of NVM array 100.

MRAM cell 502 may have an architecture somewhat resembling that of ReRAM 302 (1T1R) in ReRAM array 300, and may include a magneto-resistive element 501 and an access transistor 503. One side of magneto-resistive element 501 may connect to a source line 512, designated SL, and the other side to access transistor 503. Access transistor 503 may connect on the other side to a bit line 506, designated BL, although it may be possible, in some embodiments, that all the connections may be inverted with the transistor connecting to SL and the magneto-resistive element connecting to BL. In some embodiments, MRAM cell 502 may be interchangeable with a STT-RAM cell, which has a substantially similar architecture to the MRAM cell.

Reading operations in MRAM array 500 may be similar to that in ReRAM array 300 with the difference that, instead of discharging the bit line to 0V or a relatively low voltage and applying a relatively high voltage to the sense line as in the ReRAM array, in the MRAM array source line 512 is connected to a low voltage or ground (0V) and bit line 506 is charged to a relatively high voltage. Similarly to ReRAM array 300, the resistance voltage is sensed at bit line 506 and decoded accordingly. Writing processed data back in MRAM array 500 may be similar to that in ReRAM array 300 except that the voltages applied to the bit line and the source line therein are interchanged in MRAM array 500 for bit line 506 and source line 512. As previously mentioned with respect to the ReRAM arrays, it may be appreciated by one skilled in the art that bit line sensing may not be limited to voltage changes but, in general, to parametric changes.

CAM and T-CAM operations may be performed in MRAM array 500 based on the same principles previously described for ReRAM array 400, with the voltage of source line 512 driven to a relatively low voltage or ground. The resistance voltage may be sensed at bit line 506.

PCM Cell Array

Figure 10:
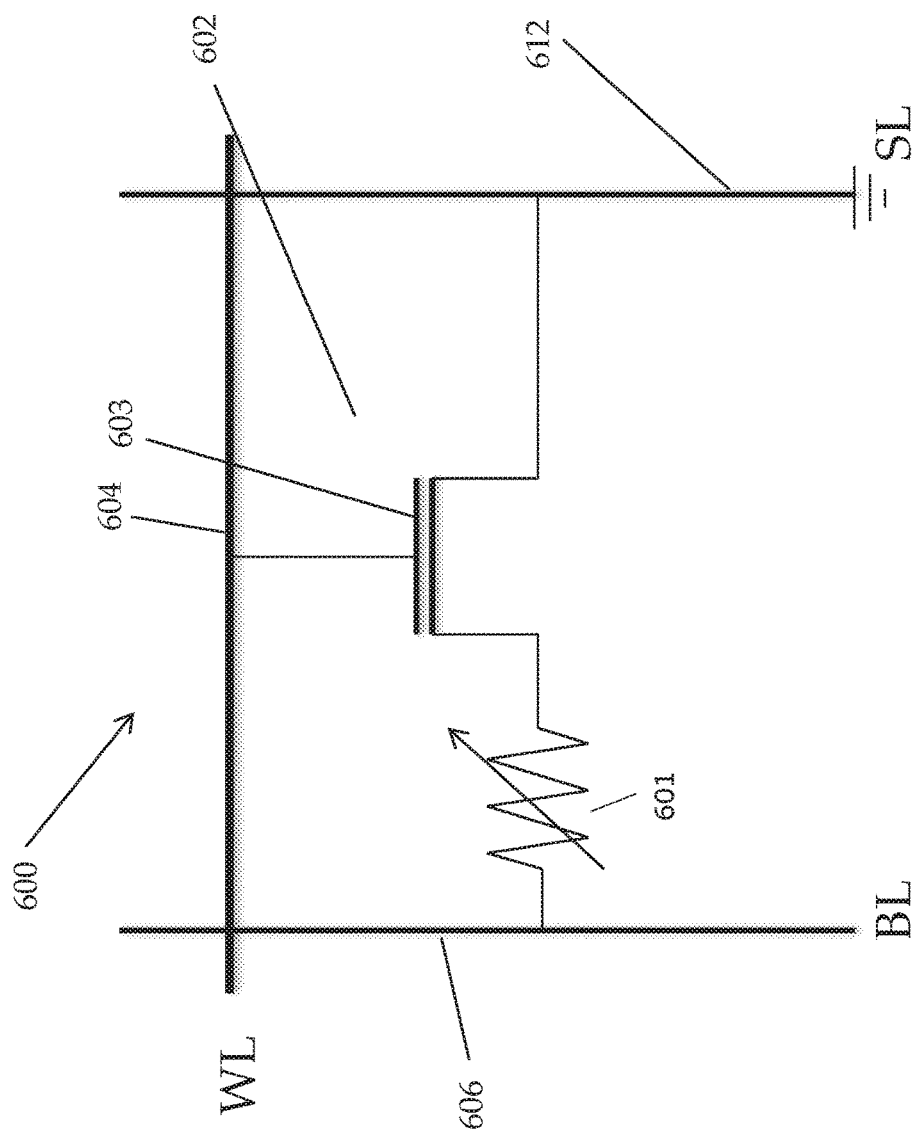
FIG. 10 schematically illustrates an exemplary PCM cell of a PCM array implementable in the in-memory processor shown in FIGS. 1A and 1B, according to an embodiment of the present invention.

Reference is now made to FIG. 10 which schematically illustrates an exemplary PCM cell 602 of a PCM array 600 implementable in in-memory processor 10 shown in FIGS. 1A and 1B, according to an embodiment of the present invention. Similarly to NVM array 100, PCM array 600 may be used for performing in-memory computations and may allow, in some embodiments, rewriting of the processed data back into PCM cells 602. Similarly to NVM array 100, in some embodiments, PCM array 600 may be implementable in the CAM unit or the T-CAM unit. In some embodiments, PCM array 600 may be implementable in the architecture of NVM array 100.

PCM cell 602 may have an architecture somewhat resembling that of ReRAM 302 in ReRAM array 300, and may include a resistive element 601 and an access transistor 603. One side of resistive element 601 may connect to a bit line 606, designated BL, and the other side to access transistor 603. Access transistor 603 may connect on the other side to a source line 612, designated SL, although, in some embodiments, it may be possible that all the connections be inverted with the transistor connecting to BL and the resistive element connecting to SL. Source line 612 may be connected to ground (0V).

Reading data from PCM array 600 and writing processed data back into the array may include similar steps to those described previously for MRAM array 500. CAM/T-CAM operations may be similarly performed also as previously described for MRAM array 500.

8-T SRAM Array

Figure 11:
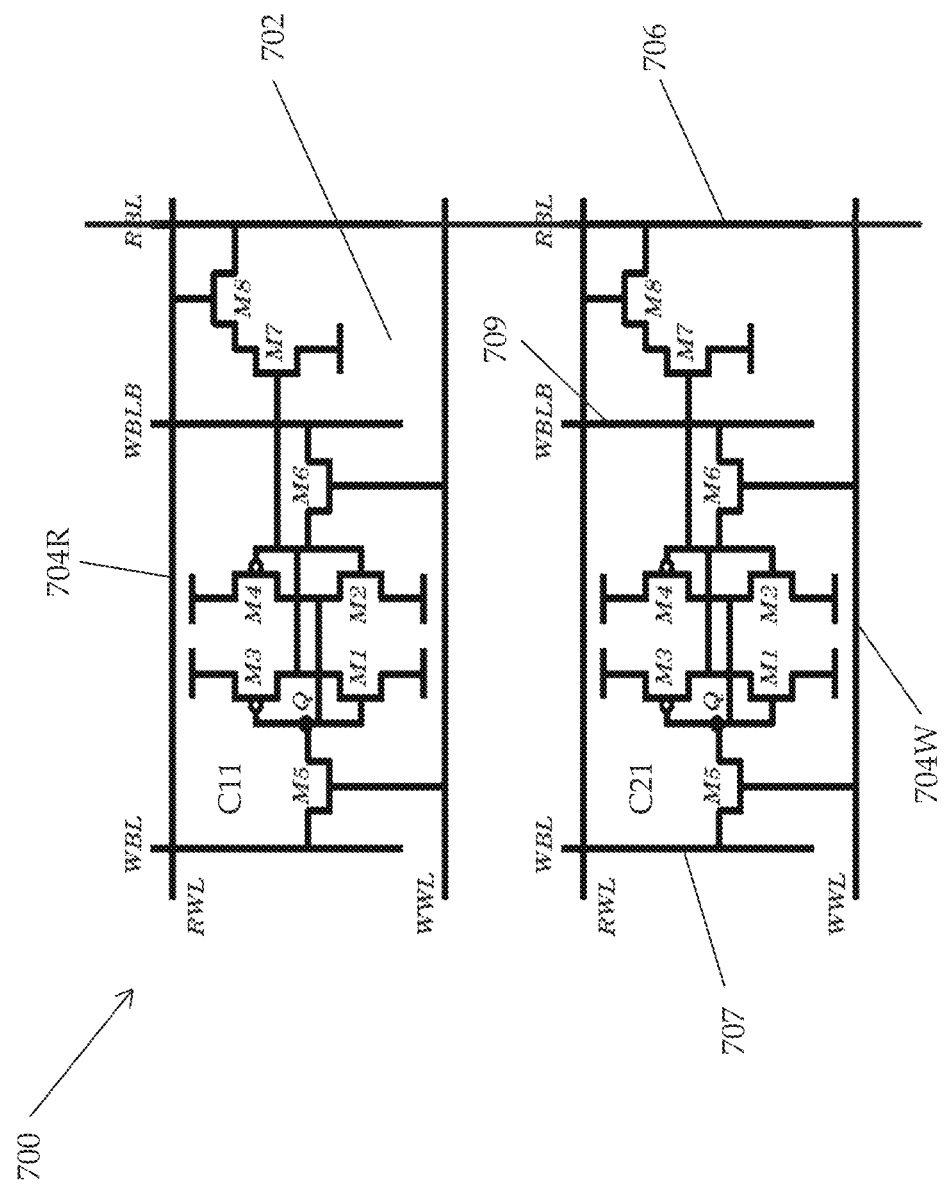
FIG. 11 schematically illustrates two exemplary 8T-SRAM cells of an 8T-SRAM array implementable in the in-memory processor shown in FIGS. 1A and 1B, according to an embodiment of the present invention.

Reference is now made to FIG. 11 which schematically illustrates two 8T-SRAM cells 702 (C11 and C21) of an 8T-SRAM array 700 implementable in in-memory processor 10 shown in FIGS. 1A and 1B, according to an embodiment of the present invention. Similarly to NVM array 100, 8T-SRAM array 700 may be used for performing in-memory computations and may allow, in some embodiments, rewriting of the processed data back into 8T-SRAM cells 702. Similarly to NVM array 100, in some embodiments, 8T-SRAM array 700 may be implementable in the CAM unit or the T-CAM unit. In some embodiments, 8T-SRAM array 700 may be implementable in the architecture of NVM array 100.

8T-SRAM cells 702 are located in a same column of 8T-SRAM array 700 and may each be connected to a read bit line 706 designated RBL, and to two write bit lines 707 and 709 designated WBL and WBLB, respectively. Read mode activation of cell 702 may be from a multiple row decoder, for example multiple row decoder 14 in FIGS. 1A and 1B, through a read word line 704R designated RWL. Write mode activation of cell 702 may similarly be performed by multiple row decoder 14 through a write word line 704W designated WWL.

The following truth table describes a read operation of C11 and C21, where values assigned to each cell may represent a charge state so that the value "0" may be associated with logical "0" and no charge in the cell and the value "1" may be associated with logical "1" and a charge in the cell. For example, C11=0 refers to C11 having no charge (storing a "0") and C11=1 refers to the cell having a charge (storing a "1"). Output refers to the signal detected by the sensing circuit (e.g. sensing circuit 18):

|  | Output |
| --- | --- |
| C11 = 0, C21 = 0 | 1 |
| C11 = 0, C21 = 1 | 0 |
| C11 = 1, C21 = 0 | 0 |
| C11 = 1, C21 = 1 | 0 |

It may be appreciated that C11 and C21 may operate as a NOR gate, and in some embodiments may additionally be operable as a CAM/T-CAM cell.

Writing back data into 8T-SRAM array 700, as previously described with reference to FIGS. 1A and 1B, may include use of write unit 20 and controller 21, or alternatively, may include use of only controller 21 to instruct multiple row decoder 14 to activate the respective write word lines 704W to write the bit line data into the respective data-receiving cells 702. In some embodiments, the data in read bit line 706 may be directly transferred to write bit lines 707 and 709 through a switching circuit. Optionally, the switching circuit may include an inverter to invert the signal in read bit line 706.

Single-Sided 3T-SRAM Array

Reference is now made to FIG. 12 which schematically illustrates two single-sided 3T-SRAM cells 802 (C11 and C21) of a single-sided 3T-SRAM array 800 implementable in in-memory processor 10 shown in FIGS. 1A and 1B, according to an embodiment of the present invention. Similarly to NVM array 100, 3T-SRAM array 800 may be used for performing in-memory computations and may allow, in some embodiments, rewriting of the processed data back into 3T-SRAM cells 802. Similarly to NVM array 100, in some embodiments, 3T-SRAM array 800 may be implementable in the CAM unit or the T-CAM unit. In some embodiments, 3T-SRAM array 800 may be implementable in the architecture of NVM array 100.

3T-SRAM cells 802 are located in a same column of 3T-SRAM array 800 and may each be connected to a read bit line 806 designated BL. Read mode activation of cell 802 may be from a multiple row decoder, for example multiple row decoder 14 in FIGS. 1A and 1B, through read word lines 804R designated RE-A and RE-B connecting to C21 and C11, respectively. Write mode activation of cells 802 may similarly be performed by multiple row decoder 14 through write word lines 804W designated WE-A and WE-B connecting to C21 and C11, respectively.

The truth table describing the read operation of C11 and C21 in 8T-SRAM array 700 may be equally applicable to C11 and C21 in 3T-SRAM array. In some embodiments, C11 and C21 may additionally be operable as a CAM/T-CAM cell.

Writing back data into 3T-SRAM array 800, as previously described with reference to FIGS. 1A and 1B, may include use of write unit 20 and controller 21, or alternatively, may include use of only controller 21 to instruct multiple row decoder 14 to activate the respective write word lines 804W to write the bit line data into the respective data-receiving cells 702.

Unless specifically stated otherwise, as apparent from the preceding discussions, it is appreciated that, throughout the specification, discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROMs), compact disc read-only memories (CD-ROMs), random access memories (RAMs), electrically programmable read-only memories (EPROMs), electrically erasable and programmable read only memories (EEPROMs), magnetic or optical cards, Flash memory, or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An in-memory computing device, comprising:
a memory array including non-volatile memory cells, each said non-volatile memory cell including one resistive element,
wherein each said non-volatile memory cell is connected to a word line, connecting a row of said non-volatile memory cells, and to a source line and a bit line, said bit line connecting to said resistive element and each said source line and each said bit line connecting a single column of said non-volatile memory cells;
a multiple row decoder to activate at least two word lines at a same time;
a bit line sensor, per selected bit line, to sense a parametric voltage change or a parametric current change related to resistances of said one resistive element in each activated cell of said selected bit line and to decode said parametric voltage change or said parametric current change in a qualitative manner as being a value between 1 and 0.

2. The device according to claim 1,
wherein said non-volatile memory cells include any one of ReRAM cells, MRAM cells, STT-RAM cells, PC-RAM cells, and PMC cells.

3. The device according to claim 1,
wherein said bit line sensor includes sensing circuitry to sense parametric change in any one of a change in voltage, a change in current, and a change in resistance.

4. The device according to claim 1, further comprising:
circuitry to write data associated with said parametric voltage change or said parametric current change into said memory array,
wherein said circuitry includes a controller to instruct said multiple row decoder to activate two or more rows in said memory array.

* * * * *